United States Patent
Turvey et al.

(10) Patent No.: US 11,824,506 B2
(45) Date of Patent: Nov. 21, 2023

(54) GLITCH REDUCTION TECHNIQUE FOR SWITCHED AMPLIFIERS HAVING SELECTABLE TRANSFER GAIN

(71) Applicant: Analog Devices International Unlimited Company, Limerick (IE)

(72) Inventors: Anthony Eric Turvey, Poughkeepsie, NY (US); Michael E. Harrell, Colorado Springs, CO (US); Murat Demirkan, Istanbul (TR)

(73) Assignee: Analog Devices International Unlimited Company, Limerick (IE)

(*) Notice: Subject to any disclaimer, the term of this patent is extended or adjusted under 35 U.S.C. 154(b) by 113 days.

(21) Appl. No.: 17/496,431

(22) Filed: Oct. 7, 2021

(65) Prior Publication Data

US 2022/0190800 A1 Jun. 16, 2022

Related U.S. Application Data

(60) Provisional application No. 63/125,014, filed on Dec. 14, 2020.

(51) Int. Cl.
*H03G 3/30* (2006.01)
*H03M 1/00* (2006.01)
*H03F 3/04* (2006.01)

(52) U.S. Cl.
CPC .............. *H03G 3/30* (2013.01); *H03F 3/04* (2013.01); *H03M 1/001* (2013.01); *H03G 2201/103* (2013.01)

(58) Field of Classification Search
CPC .... H03G 3/30; H03G 2201/103; H03G 7/001; H03G 7/08; H03G 1/0088; H03G 1/0023; H03G 3/3042; H03F 3/04; H03F 3/211; H03F 3/72; H03F 3/187; H03F 3/68; H03F 3/602; H03F 1/0288; H03F 3/195; H03M 1/001
USPC ...................................... 330/124 R, 295, 278
See application file for complete search history.

(56) References Cited

U.S. PATENT DOCUMENTS

| | | | |
|---|---|---|---|
| 6,615,028 B1* | 9/2003 | Loke .................. | H03F 3/24 455/127.1 |
| 8,130,043 B2* | 3/2012 | Arell ................... | H03F 1/0277 330/124 R |
| 8,710,927 B2* | 4/2014 | Kamitani ............. | H03F 3/245 330/51 |
| 8,749,305 B2* | 6/2014 | Retz .................... | H03F 1/0277 330/51 |

FOREIGN PATENT DOCUMENTS

DE 102021128252 6/2022

\* cited by examiner

*Primary Examiner* — Khanh V Nguyen
(74) *Attorney, Agent, or Firm* — Schwegman Lundberg & Woessner, P.A.

(57) ABSTRACT

An amplifier circuit comprises a first gain circuit path configured to provide a first signal gain to an input signal, a second gain circuit path configured to provide a second signal gain to an input signal, an auxiliary gain circuit path configured to provide an auxiliary signal gain to an auxiliary input signal, wherein the auxiliary signal gain is equal to the first signal gain minus the second signal gain, a summing circuit configured to sum the second gain signal path and the auxiliary signal path, and logic circuitry configured to change an output of the circuit between the first gain circuit path and the sum of the second gain signal path and the auxiliary signal path, and set the auxiliary input signal equal to the input signal before the changing.

20 Claims, 10 Drawing Sheets

GLITCH REDUCTION TECHNIQUE FOR SWITCHED AMPLIFIERS HAVING SELECTABLE TRANSFER GAIN

CLAIM OF PRIORITY

This application claims the benefit of priority to U.S. Provisional Application Ser. No. 63/125,014, filed Dec. 14, 2020, which is hereby incorporated by reference herein in its entirety.

BACKGROUND

Electronic circuits and systems can utilize amplifiers that provide signal gain to increase magnitude, power, etc., of an electronic signal. An amplifier with selectable gain is able to change the gain it applies to an input signal. However, changing the gain typically causes abrupt and undesirable changes to the output voltage at the output of the amplifier.

SUMMARY OF THE DISCLOSURE

This document relates generally to amplifier systems for integrated circuits. The amplifier systems have selectable transfer function gain to change between a lower resolution but high voltage range, and a higher resolution but low voltage range. In some aspects, an amplifier circuit includes a first gain circuit path configured to provide a first signal gain to an input signal, a second gain circuit path configured to provide a second signal gain to an input signal, an auxiliary gain circuit path configured to provide an auxiliary signal gain to an auxiliary input signal, wherein the auxiliary signal gain is equal to the first signal gain minus the second signal gain, a summing circuit configured to sum the second gain signal path and the auxiliary signal path, and logic circuitry configured to change an output of the circuit between the first gain circuit path and the sum of the second gain signal path and the auxiliary signal path, and set the auxiliary input signal equal to the input signal before the changing.

In some aspects, a method of changing a dynamic range of a signal source of an instrumentation circuit includes providing a first signal gain to a primary input signal to provide a first gained signal at an output of the signal source; providing a second signal gain to the primary input signal to generate a second gained signal; providing an auxiliary signal gain to an auxiliary input signal to generate a gained auxiliary signal, the auxiliary signal gain being equal to the difference between the first signal gain and the second signal gain; setting the auxiliary input signal equal to the primary input signal; and changing to providing a sum of the second gained signal and gained auxiliary signal at the output of the signal source.

In some aspects, an electronic system includes a primary gain circuit path configured to provide a first signal gain; an auxiliary gain circuit path configured to provide a second signal gain; a summing circuit configured to generate a summed signal of a sum of a signal of the primary gain circuit path and a signal of the auxiliary gain circuit path and provide the summed signal as an output signal; a feedback circuit path connected to an output of the system, and configured to adjust the signal of the primary gain circuit path to reduce a difference between the output signal and a target signal; and logic circuitry configured to selectively set the signal of the auxiliary gain circuit path to an auxiliary signal or equal to the signal of the primary gain circuit path.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
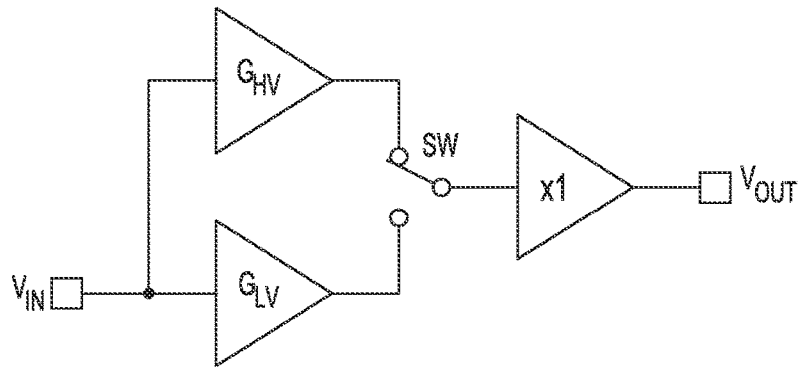
FIG. 1 is a diagram of an example of an electronic circuit with an amplifier system having a switch-selectable transfer function gain.

FIG. 1 is a diagram of an example of an electronic circuit with an amplifier system having a switch-selectable transfer function gain to apply to an input signal ($V_{IN}$) to provide a lower resolution but high voltage (HV) range, and a higher resolution but low voltage (LV) range. The amplifier system includes a circuit path providing a higher signal gain ($G_{HV}$) to the input signal, and a circuit path providing a lower signal gain ($G_{LV}$) to the input signal. The HV range circuit path or the LV range circuit path is selected using a switch mechanism (SW) that enables the desired circuit path.

The signal gains from input ($V_{IN}$) to Output ($V_{OUT}$) are designated as $G_{HV}$ and $G_{LV}$ for the lower resolution HV range circuit path and the higher resolution LV range circuit path, respectively, where $G_{HV} > G_{LV}$. The input to output transfer functions are determined by one of the following equations, depending on the state of the gain select switch:

$$V_{OUT\,(HV\,Range)} = V_{IN} G_{HV},$$

$$V_{OUT\,(LV\,Range)} = V_{IN} G_{LV}.$$

The input $V_{IN}$ can be normalized so that: $0V < V_{IN} < 1V$.

Figure 2:
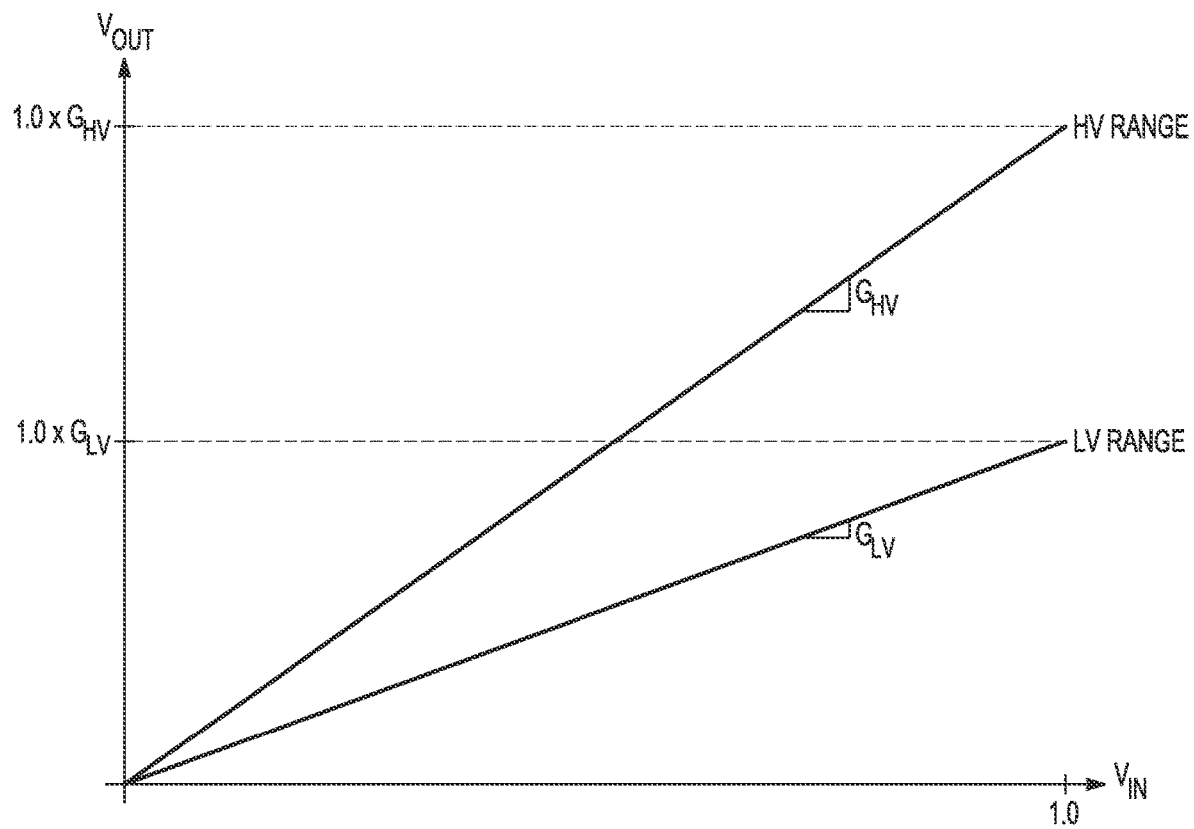
FIG. 2 is an illustration of the graphs of the output voltage as a function of the input voltage for two signal gain settings of the amplifier system of FIG. 1.

FIG. 2 is an illustration of the output voltage $V_{OUT}$ as a function of $V_{IN}$ for the HV range and the LV range. The HV range graph has slope $G_{HV}$ and the LV range graph has slope GLC. When operating at an output voltage common to the span of both the HV and LV ranges, it may be desirable to switch between the two range settings without inducing a voltage disturbance (e.g., a signal glitch) or aberration at the output. This glitch-free operation is only possible for a range of operating voltages $V_{OUT}$ that are common to the span of both the HV and LV ranges.

However, even for only those output voltages common to both the HV and LV ranges, for a constant input voltage ($V_A$) there will be an aberration at the output when the switch is changed between circuit paths. This is true for all operating points except the one where the two graphs intersect (at $V_{IN}=0V$ for the example of FIG. 2). This is because for all points not at the intersection, the output will take a different voltage for a corresponding input $V_A$ according to the different transfer functions defined above.

Figure 3:
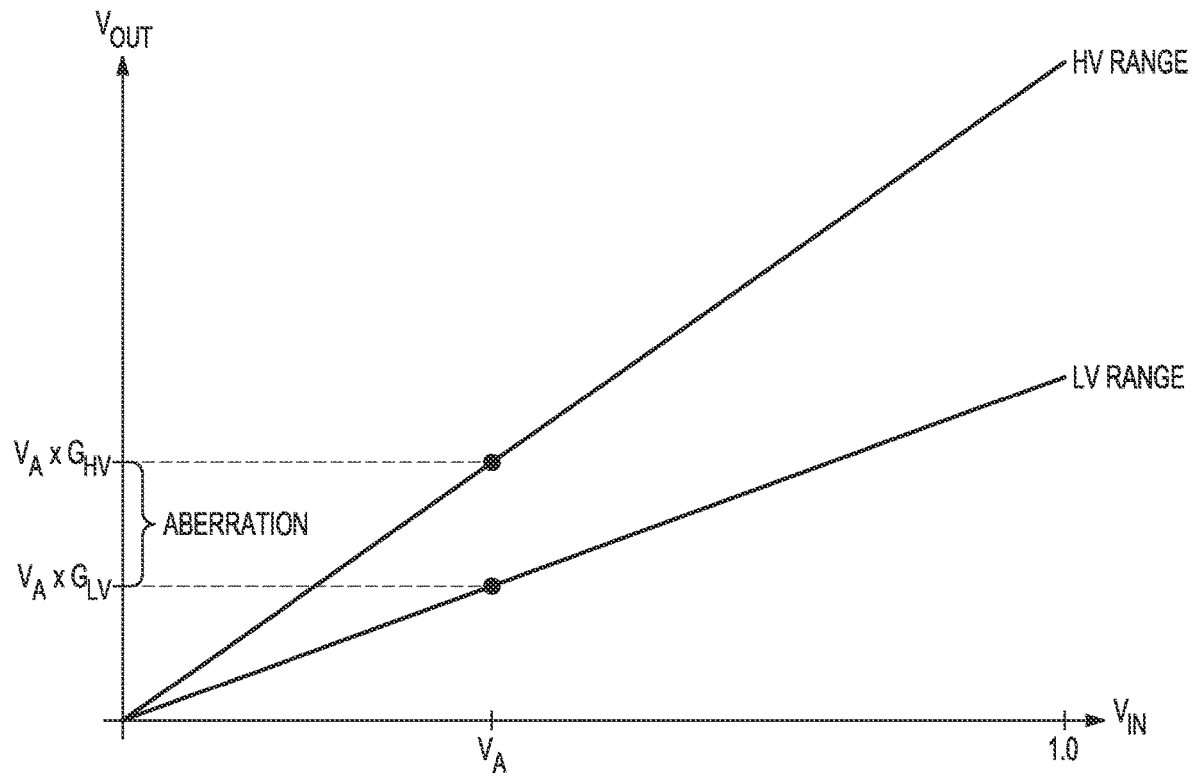
FIG. 3 shows graphs of the output voltage as a function of the input voltage for the two signal gain settings of the amplifier system of FIG. 1 and switching between the two gain settings at a point where the two gain settings do not intersect.

FIG. 3 illustrates graphs of $V^{OUT}$ as a function of $V_{IN}$ for the HV range and LV range. The graphs show the aberration for the operating point $V_{IN}=V_A$ where the two output graphs do not intersect ($V_A>0V$). As shown in the graph of FIG. 3, the aberration would be the difference $V_A[G_{HV}-G_{LV}]$ for an input $V_A$ when the position of the switch in FIG. 1 is changed between the HV range circuit path and the LV range circuit path.

Figure 4:
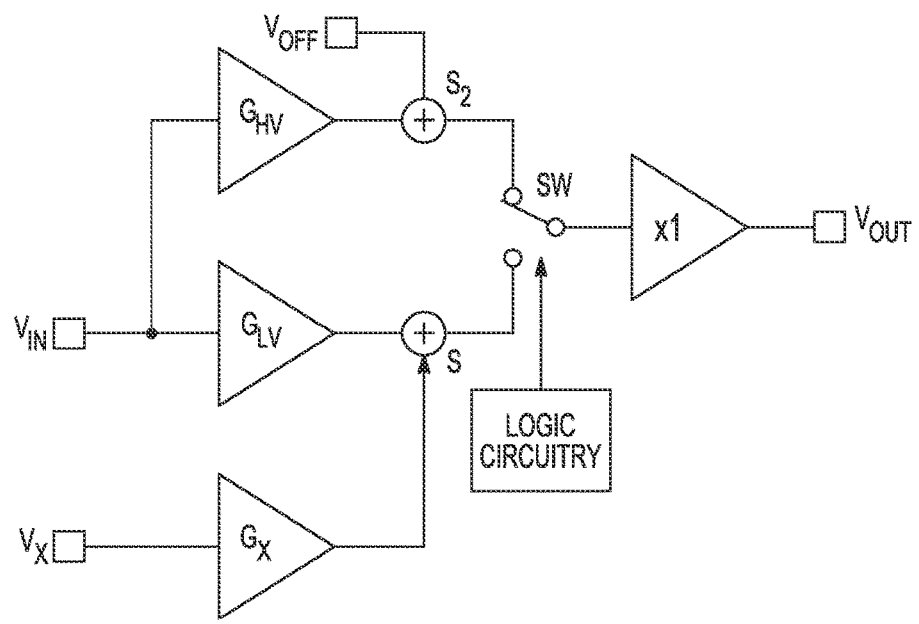
FIG. 4 is a diagram of another example of an electronic circuit that includes an amplifier system.

FIG. 4 is a diagram of another example of an electronic circuit that includes an amplifier system. The electronic circuit includes an HV range circuit path that provides signal gain $G_{HV}$ to an input signal and an LV range circuit path that provides signal gain $G_{LV}$ to an input signal. The electronic circuit also includes an auxiliary gain circuit path that provides auxiliary signal gain $G_X$ to an offset voltage $V_X$. A summing circuit (S) sums the gained signals of the LV range circuit path and the auxiliary gain circuit path. Logic circuitry changes the state of the gain select switch SW to change between the HV range mode with signal gain $G_{HV}$ to the LV range mode with an overall LV range that is sum of the circuit paths with signal gain $G_{LV}$ and signal gain $G_X$. The transfer function of the overall LV range is now:

$$V_{OUT}=V_{IN}G_{LV}+V_XG_X.$$

While gain $G_X$ may be chosen arbitrarily, by choosing $G_X=G_{HV}-G_{LV}$ so that:

$$V_{OUT}=V_{IN}G_{LV}+V_X(G_{HV}-G_{LV}),$$

it is possible to introduce a special input condition $V_X=V_{IN}$ for which the $G_{LV}$ terms cancel and only the $V_{IN}G_{HV}$ term remains. The transfer function of the overall LV range becomes identical to that of transfer function of the HV range circuit path in this special input condition.

Figure 5:
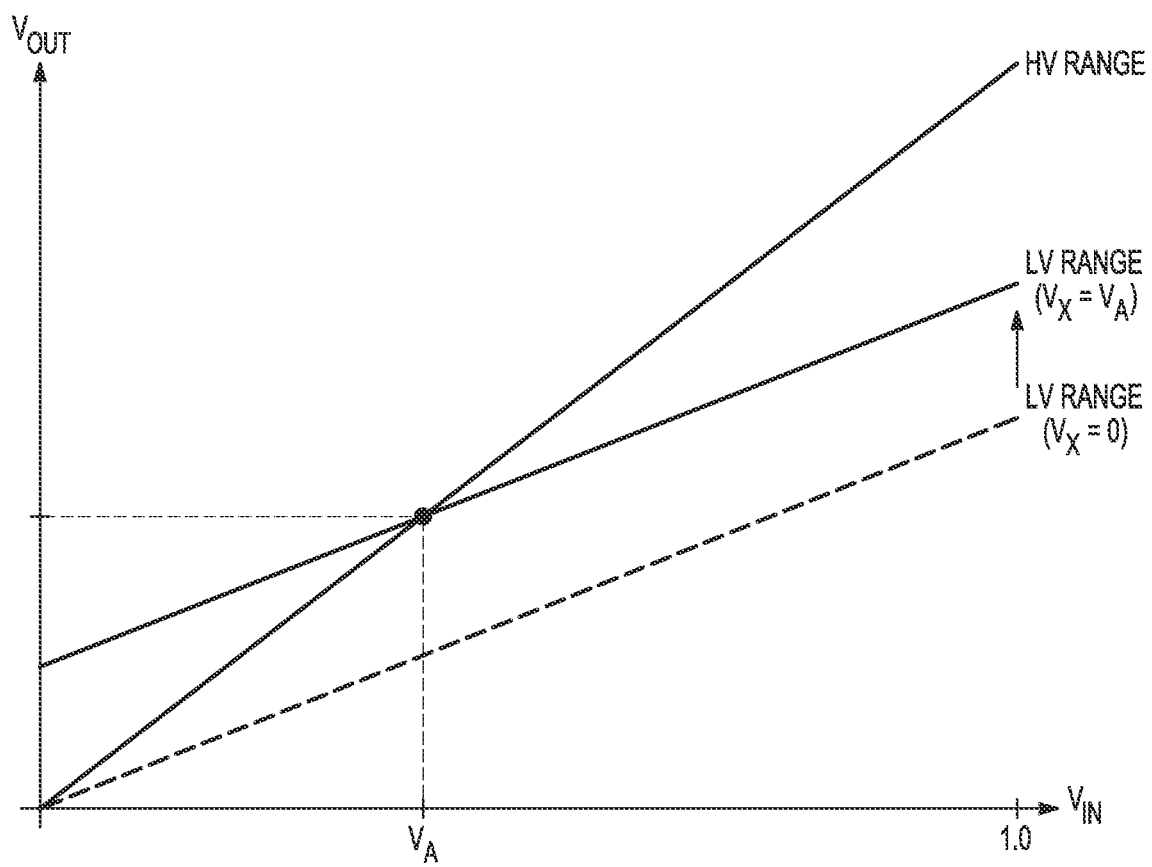
FIG. 5 shows graphs of the higher voltage range and the lower voltage range for the amplifier system of FIG. 4.

FIG. 5 illustrates graphs of $V_{OUT}$ as a function of $V_{IN}$ for the HV range and LV range for the amplifier system of FIG. 4 and the condition when $V_{IN}=V_X=V_A$. As shown in FIG. 5, setting $V_{IN}=V_X=V_A$ forces the condition that the $G_{LV}$ graph intersects the $G_{HV}$ graph at $V_{IN}=V_X=V_A$ where $V_A$ can be any chosen value. While in this special condition, the gain select switch SW can be changed without introducing any voltage aberrations (e.g., glitches) at the output.

The $V_X$ input could be adjusted over the full $V_{IN}$ range ($0V<V_X<1V$ as used in this normalized example) to cause the LV range graph to intersect any chosen point on the HV range graph. The common mode range of the LV range graph is therefore very flexible. Common mode range refers to the span of the output voltage when in the LV range. Thus, for any operating point with input voltage $V_A$, $V_X$ can be set to $V_X=V_A$ such that the LV range graph intersects the HV range graph at that operating point.

This gives rise to a secondary benefit of the circuit configuration of FIG. 4. Not only can the gain select switch (SW) in FIG. 4 be changed when the system operates at the intersecting operating point without causing an aberration at the output, but an improved voltage resolution can be achieved around any chosen operating point by switching to the LV range (i.e., the summed LV and auxiliary circuit paths) when the transfer graphs are made to intersect at that operating point. This is a very desirable property which has use in many applications, such as for driving a signal source of an instrumentation device for example.

Figure 6:
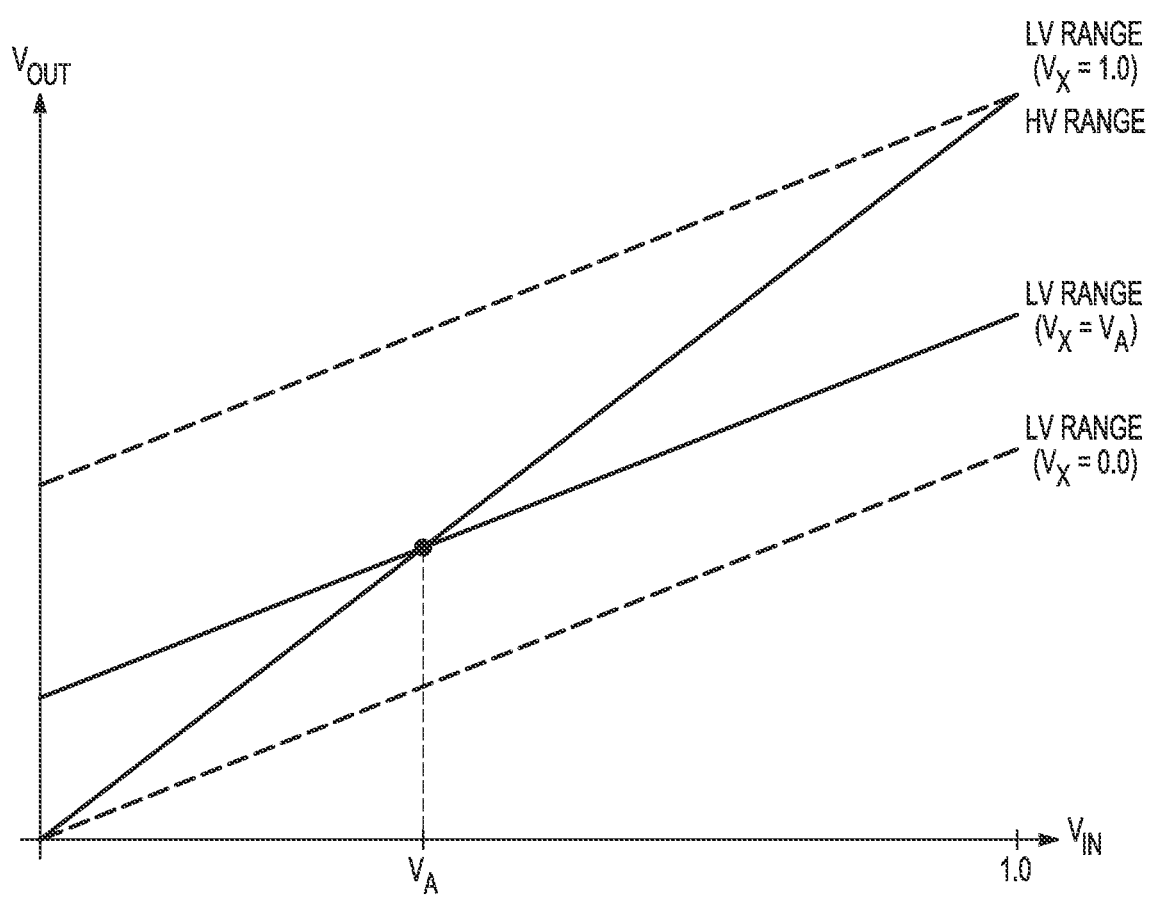
FIG. 6 shows graphs of the higher voltage range and the lower voltage range for the amplifier system of FIG. 4 and how the lower range voltage range can be extended.

FIG. 6 illustrates graphs of $V_{OUT}$ as a function of $V_{IN}$ for the HV range and LV range showing how the minimum and maximum extent of the LV range graph can be adjusted when setting $V_X$ between 0V and 1V (as normalized in this example). By spanning $0V<V_X<1V$, the LV range graph can be made to intersect with the HV range graph at any point.

Returning to FIG. 4, the HV range circuit path can include a second summing circuit $S_2$. The second summing circuit $S_2$ provides an offset ($V_{OFF}$) to the HV range to move the HV range up or down in the graph of FIG. 6 by the amount of offset.

It is not always desirable to keep the LV range transfer function at an elevated offset after the gain selection switch has been changed because it changes the common mode span that could be achieved while in the LV range. It may be desired to make an aberration free transition between HV and LV range modes, but then translate the LV graph into some other preferred common mode span after the switching is complete. This can be achieved using feedback control (and provided the output voltage remains common to the intended common mode span).

Figure 7:
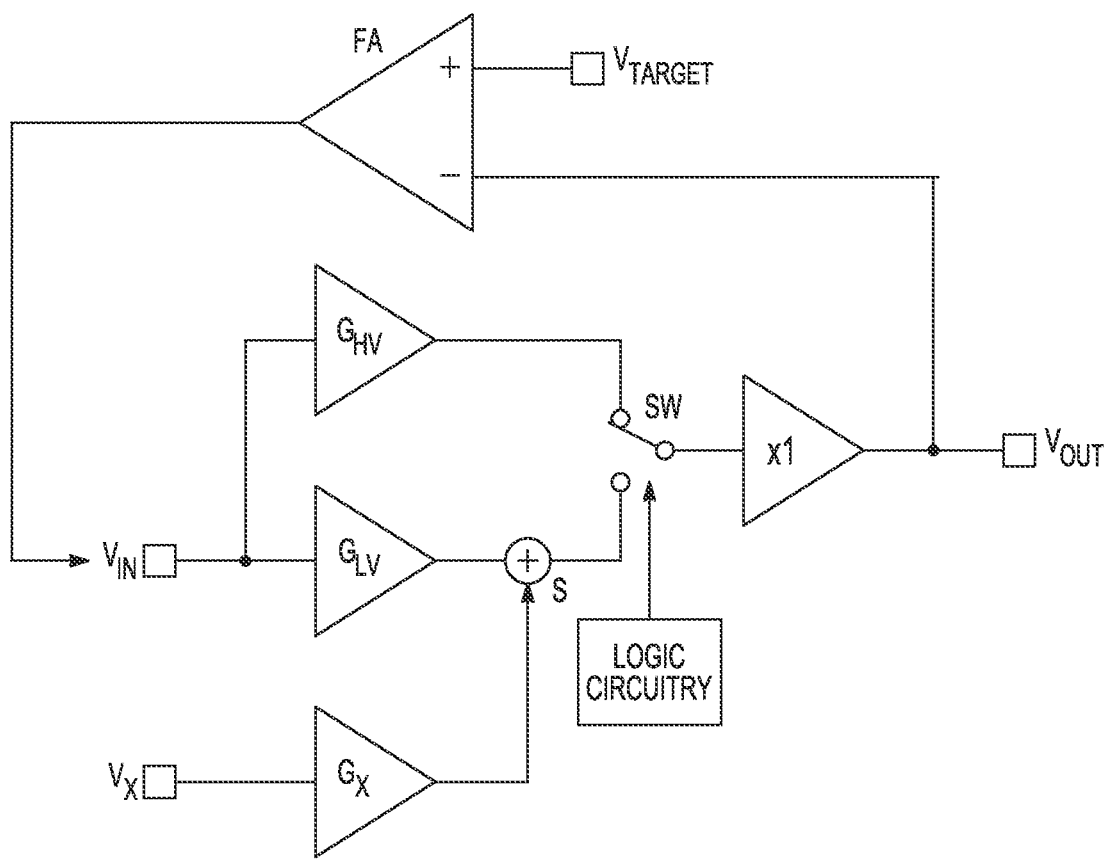
FIG. 7 is a diagram of another example of an electronic circuit that includes an amplifier system having a feedback path.

FIG. 7 is a schematic diagram of an example of an electronic circuit in which a feedback amplifier (FA) is added to the amplifier system as a servo mechanism. The feedback path is connected to the output and the input of the circuit and the feedback amplifier automatically adjusts input voltage $V_{IN}$ to the appropriate voltage so that the output ($V_{OUT}$) is held at, or moved toward, the desired target signal $V_{TARGET}$ (which may be a DC voltage for example). The feedback mechanism will act to hold the output at this target even if the LV range transfer function as shown in the LV range graph is slowly translated from one common mode span to another by changing $V_X$. The logic circuitry can include one or more of a processor, state machine, field programmable gate array (FPGA), application specific integrated circuit (ASIC) or other logic circuitry to change the value of $V_X$.

Figure 8:
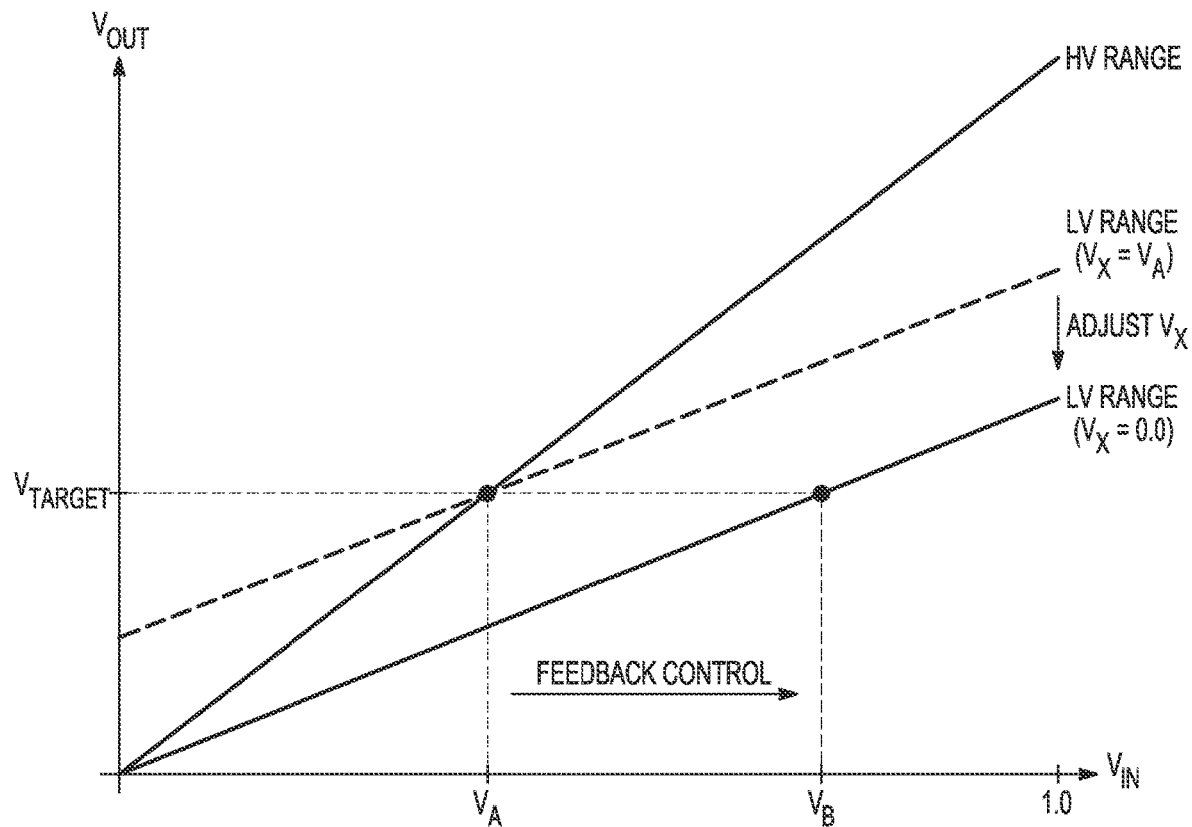
FIG. 8 shows graphs of the higher voltage range and lower voltage range to illustrate operation of the circuit of FIG. 7.

FIG. 8 are graphs of the HV range and LV range that illustrate operation of the circuit of FIG. 7 where the LV range is transitioned from the intersecting condition back down to a preferred common mode span. In the particular example shown, the $V_X$ voltage is ramped down from $V_A$ to 0V. The feedback mechanism automatically and dynamically adjusts $V_{IN}$ in such a way (from $V_A$ to $V_B$) to maintain $V_{TARGET}$ at the output, even while $V_X$ is being adjusted (e.g., using a digital-to-analog converter (DAC) or other logic circuitry), thereby translating the LV graph without disturbing the output.

Figure 9:
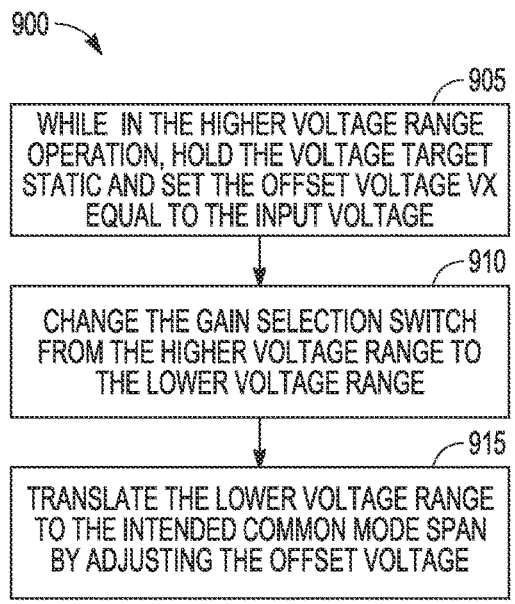
FIG. 9 is a flow diagram of an example of a method of a handoff between the HV range and the LV range of the circuit of FIG. 7

FIG. 9 is a flow diagram of an example of a method 900 of a handoff between the HV range and the LV range of the circuit of FIG. 7 without an aberration occurring at the output of the circuit. It is assumed that the output voltage $V_{OUT}$ remains within the common mode span of the LV range graph or transfer function after the LV range is translated back to its desired common mode. It would be difficult to translate the LV range graph to a desired common mode span and also maintain $V_{TARGET}$ at the output if $V_{TARGET}$ is not part of that common mode span.

At 905, while the circuit is in the HV range mode and the switch SW is connected to the $G_{HV}$ gain circuit path, $V_{TARGET}$ is held static or constant, and the offset voltage is set equal to the input voltage, or $V_X=V_{IN}$. The input voltage should be at or near $V_{TARGET}$. This translates the LV range graph such that it intersects the HV range graph at the operating point.

At 910, the circuit is changed from the HV range mode to LV range by changing gain selection switch SW to the output of the summing circuit S. There will be no aberration at the output because the change was made at an operating point where the two ranges intersect.

At 915, the LV range transfer function or graph is translated to the desired common mode span by adjusting the offset voltage IC. The feedback amplifier FA automatically controls $V_{IN}$ such that $V_{TARGET}$ is maintained at the output during the entire operation.

The above operation completes a handoff between HV range and LV range, at some arbitrary (static) operating point with no appreciable glitch or aberration at the output. The LV range graph was then translated to a common mode span starting at 0V. The feedback amplifier FA enforced the $V_{TARGET}$ condition at the output during the entire operation by automatically and dynamically controlling $V_{IN}$. The inverse operation of a handoff between the LV range and the HV range could have also been demonstrated, and it should be clear to one skilled in the art upon reading this detailed description how to implement such a sequence.

Figure 10:
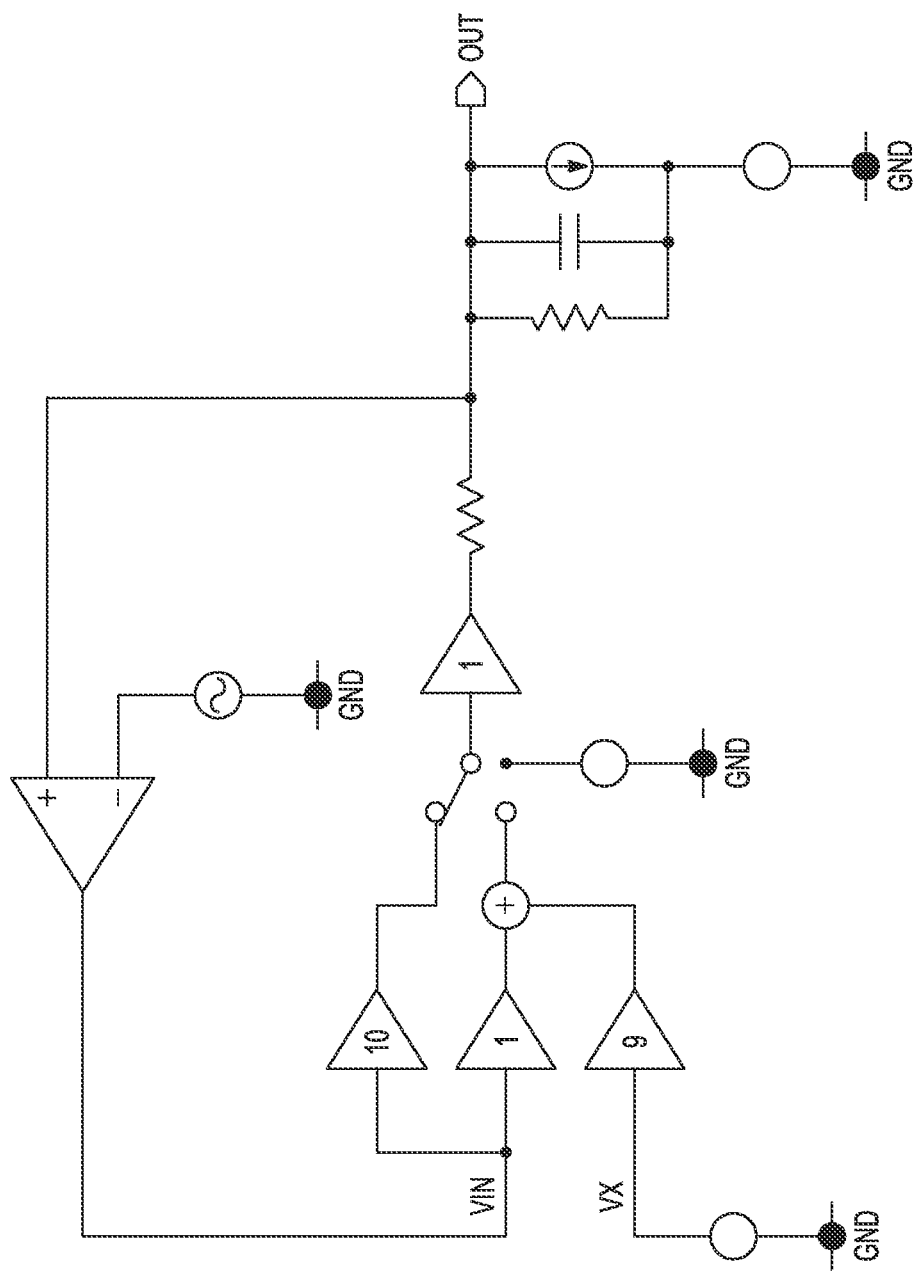
FIG. 10 is a circuit schematic used for simulation of the circuit of FIG. 7.

FIG. 10 is a circuit schematic used for circuit simulation consistent with the above principles. The gain parameters have been chosen such that $G_{HV}=10$, $G_{LV}=1$, and $G_X=10-1=9$ as described previously herein. For the simulation, the input span was similarly normalized to $0V<V_{IN}<1V$. The gain parameters were arbitrarily chosen to support a 0V to +10V span in the HV range and a +1V span (at selectable common mode) in the LV Range. Some loading elements are included at the output as well as a series output resistance to model nonidealities in the circuit of FIG. 7.

Figure 11:
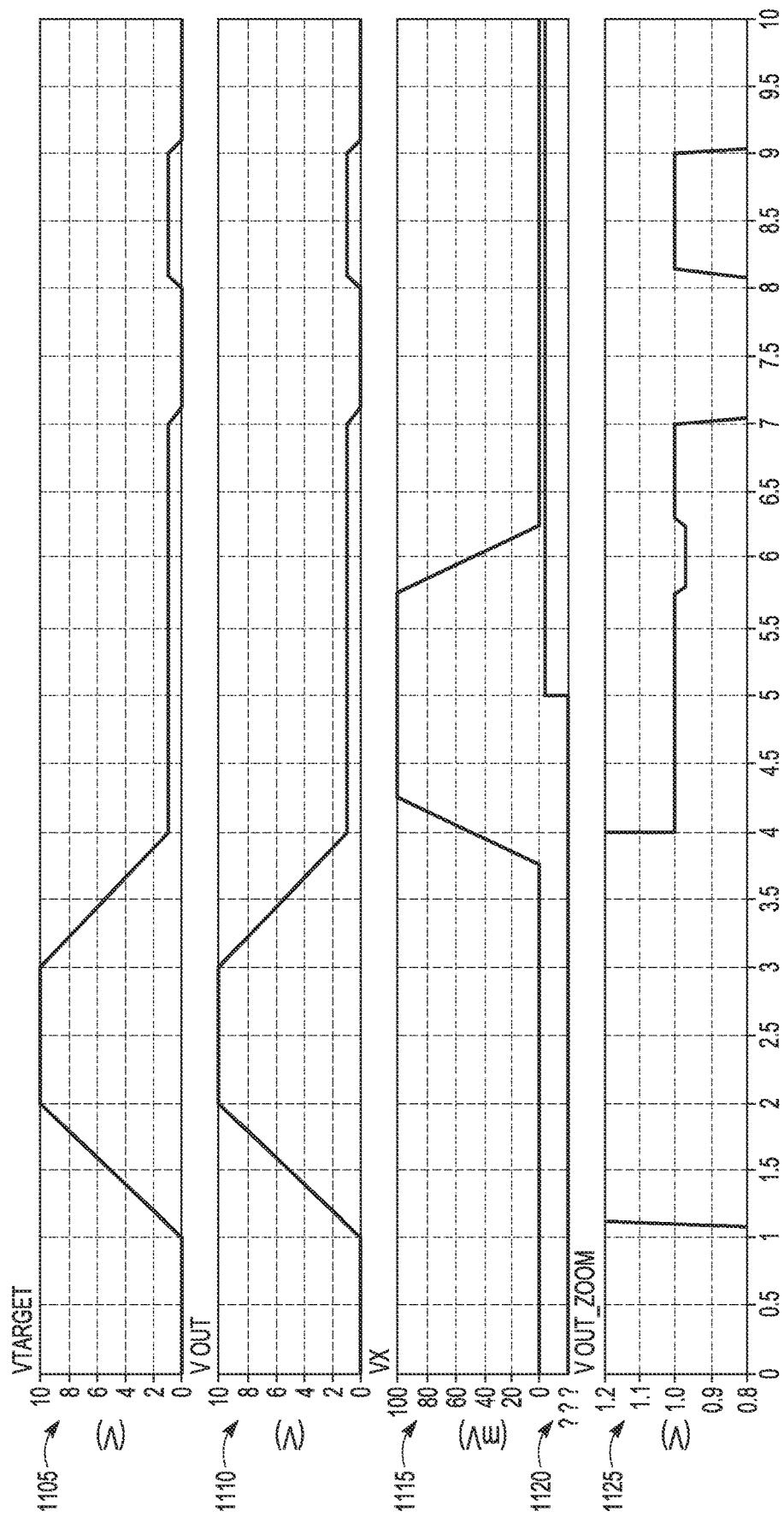
FIG. 11 is a waveform of the output of the simulation of the circuit of FIG. 10.

FIG. 11 is a waveform of the output of the simulation of the circuit of FIG. 10. The simulation demonstrates a handoff from the HV range mode to the LV range mode at an arbitrarily chosen operating point $V_{OUT}=+1V$. This output voltage is common to both the HV range as well as the LV range when it is offset to an intended common mode span that starts at 0V.

In the waveform diagram of FIG. 11, the simulation proceeds in time from 0 microseconds (t=0 μs) to 10 μs. The gain selection switch is initially set to select the HV range, and for the first 5 μs the $V_{TARGET}$ voltage (waveform 1105) commands $V_{OUT}$ (waveform 1110) via the feedback amplifier to transition from 0V to +10V and then back again to +1V, thus demonstrating operation in the lower resolution HV range mode.

At time t=4 μs, the output is held static at +1V (which implies $V_{IN}=0.1V$ for a gain of $G_{HV}=10$ and corresponds to the parameter V in the examples previously presented herein). From about t=3.75 μs to t=4.25 μs, the $V_X$ offset level (waveform 1115) is ramped from 0V such that $V_X=V_{IN}=0.1V$. This is the desired condition for an aberration free switch from the HV range to the LV range. At t=5 μs, $V_X$ has been set to match $V_{IN}$, and the gain select switch signal (waveform 1120) changes the state of the gain selection switch from the HV range to the LV range. The simulation shows that no aberration is present in the output at t=5 μs when the switch is changed.

At approximately t=6 μs, the $V_X$ level is ramped back down toward 0V so that the LV range transfer function returns to a common mode span from the 0V to +1V output range. The $V_{TARGET}$ signal (waveform 1105) then commands $V_{OUT}$ (waveform 1110) to transition from +1V to 0V, back to +1V, and again to 0V. This demonstrates the system is now operating in the LV range mode over the preferred common mode span.

The bottom waveform 1125 ($V_{OUT\_ZOOM}$) provides a zoomed-in view of $V_{OUT}$ to confirm that the glitch at t=5 μs has been eliminated using the techniques described above. There is a small deviation in the output from about t=5.8 μs to t=6.2 μs which is caused by the ramp of $V_X$ from the intersect condition back down to the desired common mode for LV range. This nonideality at the output is caused by the feedback amplifier for which a finite gain and bandwidth has been modelled. With a suitably fast amplifier (or sufficiently slow $V_X$ ramp) this aberration can be reduced to an acceptably small amplitude.

It is possible to further improve the architecture by recognizing that with the choice $G_X=G_{HV}=G_{LV}$ it is no longer necessary to provide an explicit amplifier for $G_{HV}$. The reason is because a summation of $G_{LV}$ and $G_X$ yields an equivalent net gain $G_{HV}$.

Figure 12:
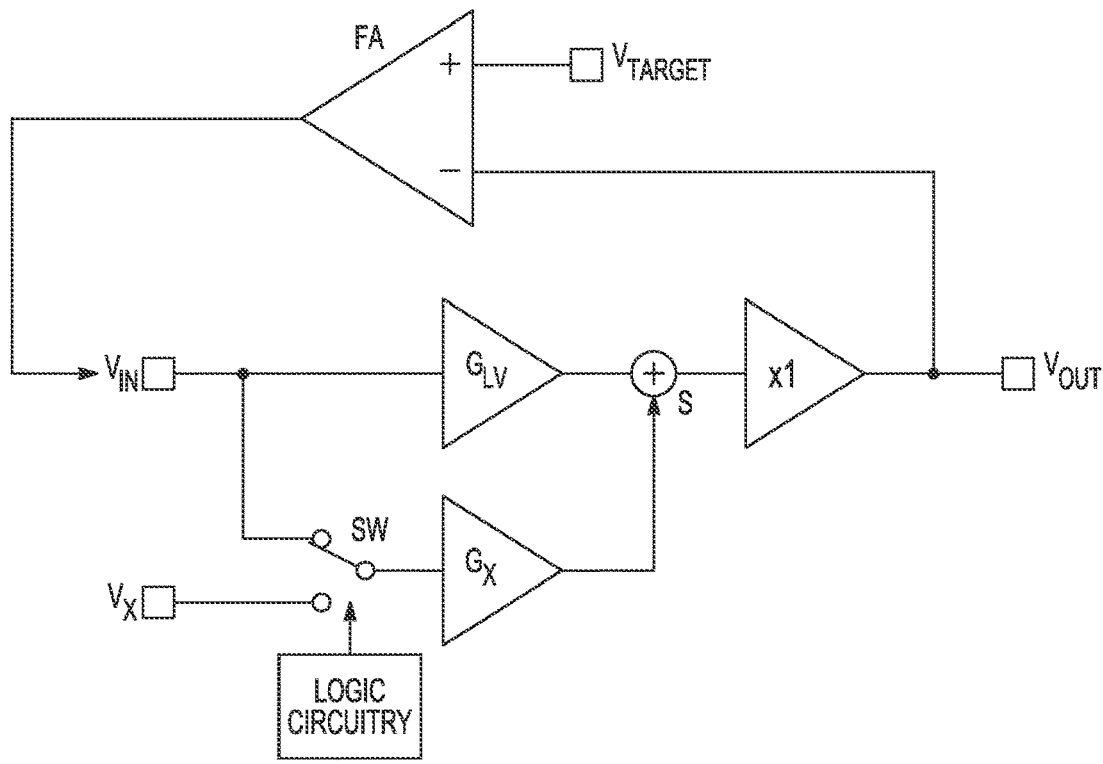
FIG. 12 is a circuit schematic of another example of an amplifier system.

FIG. 12 is a circuit schematic of an example of an amplifier system where the $G_{HV}$ amplifier has been removed and the switch SW has been relocated to the input side of the $G_X$ amplifier. With the switch in the upper setting (as shown in FIG. 12) the gain from $V_{IN}$ to $V_{OUT}$ is $G_{LV}+G_X=G_{HV}$, and by changing the switch to the lower setting the total gain is $G_{LV}$ but with a static offset determined by $V_X$ and $G_X$ as described previously herein. Operation can now be achieved in both the HV and LV ranges just as before, but without the $G_{HV}$ amplifier. The above analysis and techniques equally apply, and so aberrations in the output can be eliminated provided $V_X$ is made to match $V_{IN}$ before the switch setting is changed.

Figure 13:
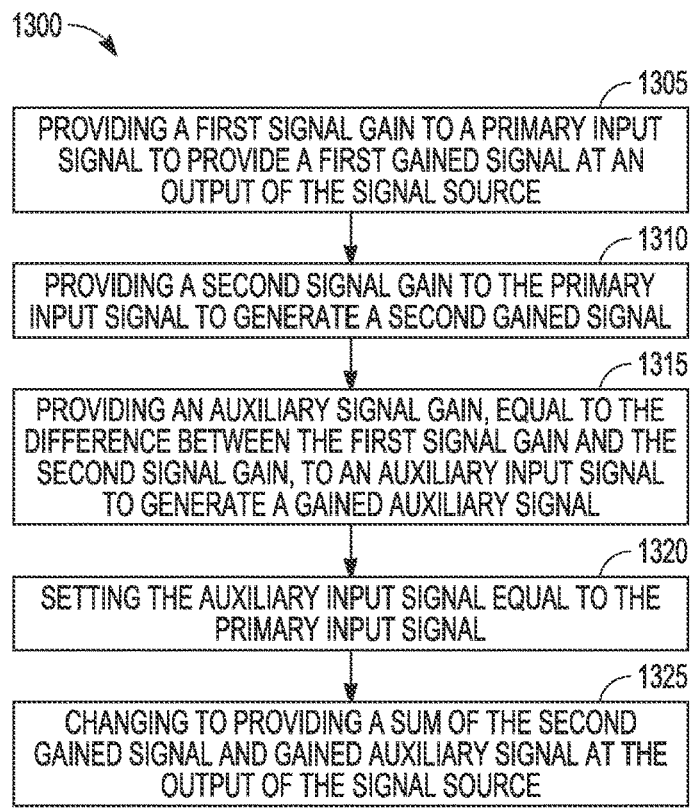
FIG. 13 is a flow diagram of an example of a method of changing a dynamic range of a signal source.

For completeness, FIG. 13 is a flow diagram of an example of a method 1300 of changing a dynamic range of a signal source of an instrumentation circuit. The method can be performed using the amplifier systems of the examples of FIGS. 4, 7 and 12. At 1305, a first signal gain is provided to a primary input signal to provide a first gained signal at an output of the signal source. At 1410, a second signal gain is provided to the primary input signal to generate a second gained signal. The first signal gain may be a higher signal gain $G_{HV}$ and the second signal gain may be a lower signal gain $G_{LV}$ lower than $G_{HV}$. In an illustrative example, the higher signal gain increases the magnitude of the input signal by 10 and the lower gain increases the magnitude of the input signal by 2.

At block 1315, an auxiliary signal gain $G_X$ is provided to an auxiliary input signal $V_X$ to generate a gained auxiliary signal. The auxiliary signal gain is equal to the difference between the first signal gain and the second signal gain. In the illustrative example, the auxiliary gain increases the magnitude of $V_X$ by 8 ($G_{HV}-G_{LV}$). If the high gain is selected and it is desired to change to the lower gain, the auxiliary input signal is set equal to the primary input signal ($V_X=V_{IN}$) and the output is changed to the sum of the second gained signal and the gained auxiliary signal (e.g., by using a gain selection switch). The lower gain is applied to the primary input signal. To switch back to the higher gain, the auxiliary input signal is again set equal to the primary input signal, and the output is changed to the higher gain path (e.g., using a gain selection switch).

In implementations of the amplifier systems described herein, the input voltages could be created by digital-to-analog converters (DACs). Furthermore, the feedback amplifier could be replaced with an analog-to-digital converter (ADC) combined with logic circuitry that provides suitable control. The logic circuitry may include a control circuit that may be implemented in a field programmable gate array (FPGA).

Figure 14:
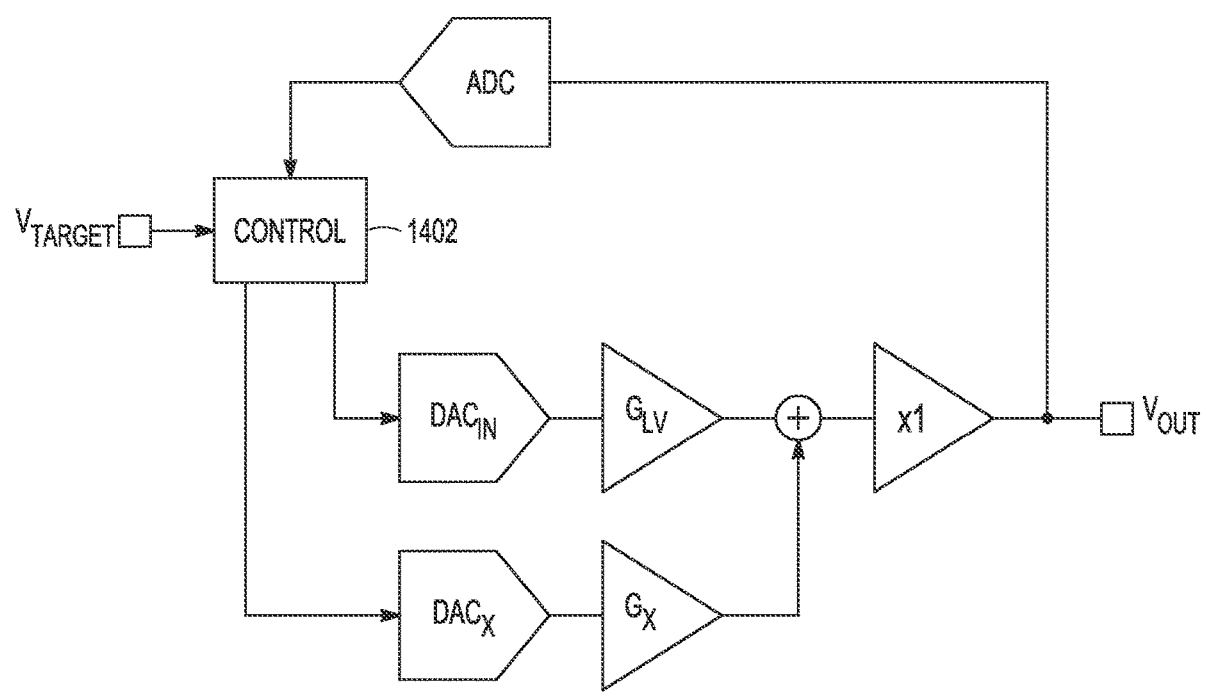
FIG. 14 is a circuit schematic of a further example of an amplifier system.

FIG. 14 is a circuit schematic of an example of an amplifier system where the range control switch has been removed, and the inputs are driven by DACs with feedback provided by an ADC and control circuit 1402. In this example, the action of the gain select switch (SW) is replaced by suitable control of the DACs by the control circuit 1402. For example, when operation is required in the HV range, the control circuit 1402 drives the DACs concurrently such that they present equal voltages to the amplifier inputs. The composite gain is therefore $G_{LV}+G_X=G_{HV}$ just as in the previous examples. When operation is required in the LV range, the control circuit 1402 simply freezes the $V_X$ input at the present operating condition and proceeds to do any subsequent control exclusively through the $DAC_{IN}$ path, thereby resulting in a gain $G_{LV}$. Because the inputs to $G_{LV}$ and $G_X$ amplifiers are equal when exclusive control through the $DAC_{IN}$ path begins, there will be no discontinuity during the range switching operation.

The reverse range switching (from LV back to HV range) is achieved by ramping $DAC_X$ toward the $DAC_{IN}$ while letting the digital feedback continue to servo $DAC_{IN}$ such that $V_{TARGET}$ is maintained at the output. When the contents of $DAC_{IN}$ and $DAC_X$ once again match, any subsequent feedback control from that point forward is achieved by again driving the DACs concurrently so that the $V_X=V_{IN}$ condition is maintained. This effectively returns the system back to the HV range without any discontinuity or aberration at the output.

Without the techniques described herein, changing the gain setting would cause a glitch at the output, or the gain setting would have to be changed when the input $V_{IN}$ is equal to 0V. In the simulation example described an output glitch of −0.9V would have occurred when the gain selection switch (SW) changed to the LV range from the HV range while in the condition $V_{OUT}=+1V$. The analysis and simulation results confirm that the output aberration due to a change in signal gain is reduced and nearly eliminated when using the described techniques, and several implementation variations have been envisioned and presented.

ADDITIONAL DESCRIPTION AND ASPECTS

A first Aspect (Aspect 1) includes subject matter (such as an amplifier circuit) comprising a first gain circuit path configured to provide a first signal gain to an input signal, a second gain circuit path configured to provide a second signal gain to an input signal, an auxiliary gain circuit path configured to provide an auxiliary signal gain to an auxiliary input signal, wherein the auxiliary signal gain is equal to the first signal gain minus the second signal gain, a summing circuit configured to sum the second gain signal path and the auxiliary signal path, and logic circuitry configured to change an output of the circuit between the first gain circuit path and the sum of the second gain signal path and the auxiliary signal path, and set the auxiliary input signal equal to the input signal before the changing.

In Aspect 2, the subject matter of Aspect 1 optionally includes a feedback circuit path connected from the output of the circuit to an input of the circuit, and configured to adjust the input signal to reduce a difference between an output signal and a target signal.

In Aspect 3, the subject matter of Aspect 2 optionally includes logic circuitry configured to change the auxiliary input signal to change a common mode span of the second signal path when the output of the circuit is from the sum of the second gain signal path and the auxiliary signal path.

In Aspect 4, the subject matter of Aspect 2 optionally includes a target signal is a direct current (DC) voltage signal.

In Aspect 5, the subject matter of one or any combination of Aspects 1-4 optionally includes a first signal path that includes another summing circuit configured to provide an offset voltage to a signal of the first gain signal path.

In Aspect 6, the subject matter of one or any combination of Aspects 1-5 optionally includes logic circuitry configured to change the auxiliary input signal to change an operating range of the second signal path when the output of the circuit is from the sum of the second gain signal path and the auxiliary signal path.

Aspect 7 includes subject matter (such as a method of changing a dynamic range of a circuit) or can optionally be combined with one or any combination of Aspects 1-6 to include such subject matter, comprising providing a first signal gain to a primary input signal to provide a first gained signal at an output of the signal source, providing a second signal gain to the primary input signal to generate a second gained signal, providing an auxiliary signal gain to an auxiliary input signal to generate a gained auxiliary signal with the auxiliary signal gain equal to the difference between the first signal gain and the second signal gain, setting the auxiliary input signal equal to the primary input signal, and changing to providing a sum of the second gained signal and gained auxiliary signal at the output of the signal source.

In Aspect 8, the subject matter of Aspect 7 optionally includes changing the primary input signal after changing to providing the sum of the second gained signal and gained auxiliary signal at the output of the signal source.

In Aspect 9, the subject matter of Aspect 8 optionally includes changing the auxiliary input signal equal to the primary input signal, and changing to providing the first gained signal at the output of the signal source.

In Aspect 10, the subject matter of one or any combination of Aspects 7-10 optionally includes changing an operating range of the second signal path by changing the auxiliary input signal when providing the sum of the second gained signal and gained auxiliary signal to the output of the signal source.

In Aspect 11, the subject matter of one or any combination of Aspects 7-10 optionally includes providing the first signal gain to the primary input signal further includes providing the first signal gain to the primary input signal and summing the gained primary input with an offset voltage to provide the first gained signal at the output of the signal source.

In Aspect 12, the subject matter of one or any combination of Aspects 7-11 optionally includes comparing an output signal at the output of the signal source to a target signal, and adjusting the primary input signal to reduce a difference between the output signal and the target signal.

In Aspect 13, the subject matter of one or any combination of Aspects 7-12 optionally includes changing a common mode range of the second signal path by changing the auxiliary input when providing the sum of the second gained signal and gained auxiliary signal to the output of the signal source.

Aspect 14 can include subject matter (such as an electronic system) or can optionally be combined with one or any combination of Aspects 1-13 to include such subject matter, comprising a primary gain circuit path configured to provide a first signal gain, an auxiliary gain circuit path configured to provide a second signal gain, a summing circuit configured to generate a summed signal of a sum of a signal of the primary gain circuit path and a signal of the auxiliary gain circuit path and provide the summed signal as an output signal, a feedback circuit path connected to an output of the system, and configured to adjust the signal of the primary gain circuit path to reduce a difference between the output signal and a target signal, and logic circuitry configured to selectively set the signal of the auxiliary gain circuit path to an auxiliary signal or equal to the signal of the primary gain circuit path.

In Aspect 15, the subject matter of Aspect 14 optionally includes a feedback circuit path that includes an amplifier coupled from the output to an input of the primary gain path, and logic circuitry that includes a switching circuit configured to set the signal on the auxiliary gain circuit path to the auxiliary signal or to an input signal to the primary gain circuit path.

In Aspect 16, the subject matter of one or both of Aspects 14 and 15 optionally includes a primary gain circuit path includes an input digital-to-analog converter (DAC) circuit, an auxiliary gain circuit path that includes an auxiliary DAC circuit, and logic circuitry includes a control circuit configured to set the signal of the primary gain circuit path using the input DAC circuit, and set the signal of the auxiliary gain circuit path using the auxiliary DAC circuit.

In Aspect 17, the subject matter of Aspect 16 optionally includes a feedback path includes an analog-to-digital converter (ADC) circuit, and a control circuit configured to set the output signal equal to the target signal by setting one or both of an output of the input DAC circuit and an output of the auxiliary DAC circuit equal to the target signal.

In Aspect 18, the subject matter of one or both of Aspects 16 and 17 optionally includes a control circuit configured to set the output of the auxiliary DAC equal to the output of the input DAC before changing the output of the input DAC circuit.

In Aspect 19, the subject matter of one or any combination of Aspects 16-18 optionally includes a control circuit is configured to hold the output of the auxiliary DAC constant and vary the output of the input DAC after setting the output of the auxiliary DAC equal to the output of the input DAC.

In Aspect 20, the subject matter of one or any combination of Aspects 16-19 optionally includes a control circuit configured to vary the outputs of the auxiliary DAC circuit and the input DAC circuit to equal values after setting the output of the auxiliary DAC equal to the output of the input DAC.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An amplifier circuit comprising:
   a first gain circuit path configured to provide a first signal gain to an input signal;
   a second gain circuit path configured to provide a second signal gain to the input signal;
   an auxiliary gain circuit path configured to provide an auxiliary signal gain to an auxiliary input signal, wherein the auxiliary signal gain is equal to the first signal gain minus the second signal gain;
   a summing circuit configured to sum the second gain circuit path and the auxiliary gain circuit path; and
   logic circuitry configured to change an output of the amplifier circuit between the first gain circuit path and the sum of the second gain circuit path and the auxiliary circuit path, and set the auxiliary input signal equal to the input signal before the changing.

2. The amplifier circuit of claim 1, including a feedback circuit path connected from the output of the amplifier circuit to an input of the amplifier circuit, and configured to adjust the input signal to reduce a difference between an output signal and a target signal.

3. The amplifier circuit of claim 2, wherein the logic circuitry is configured to change the auxiliary input signal to change a common mode span of the second gain circuit path when the output of the amplifier circuit is from the sum of the second gain signal path and the auxiliary gain circuit path.

4. The amplifier circuit of claim 2, wherein the target signal is a direct current (DC) voltage signal.

5. The amplifier circuit of claim 1, wherein the first gain circuit path includes another summing circuit configured to provide an offset voltage to a signal of the first gain circuit path.

6. The amplifier circuit of claim 1, wherein changing the auxiliary input signal changes an operating range of the second gain circuit path when the output of the amplifier circuit is from the sum of the second gain circuit path and the auxiliary gain circuit path.

7. A method of changing a dynamic range of a signal source, the method comprising:
  providing a first signal gain to a primary input signal to provide a first gained signal at an output of the signal source;
  providing a second signal gain to the primary input signal to generate a second gained signal;
  providing an auxiliary signal gain to an auxiliary input signal to generate a gained auxiliary signal, wherein the auxiliary signal gain is equal to a difference between the first signal gain and the second signal gain;
  setting the auxiliary input signal equal to the primary input signal; and
  changing to providing a sum of the second gained signal and gained auxiliary signal at the output of the signal source.

8. The method of claim 7, including changing the primary input signal after changing to providing the sum of the second gained signal and gained auxiliary signal at the output of the signal source.

9. The method of claim 8, including:
  changing the auxiliary input signal equal to the primary input signal; and
  changing to providing the first gained signal at the output of the signal source.

10. The method of claim 7, including changing an operating range of the second gain circuit path by changing the auxiliary input signal when providing the sum of the second gained signal and gained auxiliary signal to the output of the signal source.

11. The method of claim 7, wherein providing the first signal gain to the primary input signal further includes providing the first signal gain to the primary input signal and summing the gained primary input signal with an offset voltage to provide the first gained signal at the output of the signal source.

12. The method of claim 7, including:
  comparing an output signal at the output of the signal source to a target signal; and
  adjusting the primary input signal to reduce a difference between the output signal and the target signal.

13. The method of claim 12, including changing a common mode range of the second gain circuit path by changing the auxiliary input signal when providing the sum of the second gained signal and gained auxiliary signal to the output of the signal source.

14. An electronic system, the system comprising:
  a primary gain circuit path configured to provide a first signal gain;
  an auxiliary gain circuit path configured to provide a second signal gain;
  a summing circuit configured to generate a summed signal of a sum of a signal of the primary gain circuit path and a signal of the auxiliary gain circuit path and provide the summed signal as an output signal;
  a feedback circuit path connected to an output of the system, and configured to adjust the signal of the primary gain circuit path to reduce a difference between the output signal and a target signal; and
  logic circuitry configured to selectively set the signal of the auxiliary gain circuit path to an auxiliary signal or equal to the signal of the primary gain circuit path.

15. The system of claim 14,
  wherein the feedback circuit path includes an amplifier coupled from the output to an input of the primary gain circuit path; and
  wherein the logic circuitry includes a switching circuit configured to set the signal of the auxiliary gain circuit path to the auxiliary signal or to an input signal to the primary gain circuit path.

16. The system of claim 14,
  wherein the primary gain circuit path includes an input digital-to-analog converter (DAC) circuit;
  wherein the auxiliary gain circuit path includes an auxiliary DAC circuit; and
  wherein the logic circuitry includes a control circuit configured to set the signal of the primary gain circuit path using the input DAC circuit, and set the signal of the auxiliary gain circuit path using the auxiliary DAC circuit.

17. The system of claim 16,
  wherein the feedback path includes an analog-to-digital converter (ADC) circuit; and
  wherein the control circuit is configured to set the output signal equal to the target signal by setting one or both of an output of the input DAC circuit and an output of the auxiliary DAC circuit equal to the target signal.

18. The system of claim 16, wherein the control circuit is configured to set the output of the auxiliary DAC circuit equal to the output of the input DAC circuit before changing the output of the input DAC circuit.

19. The system of claim 16, wherein the control circuit is configured to hold the output of the auxiliary DAC circuit constant and vary the output of the input DAC circuit after setting the output of the auxiliary DAC circuit equal to the output of the input DAC circuit.

20. The system of claim 16, wherein the control circuit is configured to vary the outputs of the auxiliary DAC circuit and the input DAC circuit to equal values after setting the output of the auxiliary DAC circuit equal to the output of the input DAC circuit.

* * * * *